United States Patent [19]

Trahan et al.

[11] Patent Number: 5,714,411

[45] Date of Patent: Feb. 3, 1998

[54] PROCESS FOR FORMING A SEMICONDUCTOR DEVICE INCLUDING A CAPACITOR

[75] Inventors: Robert J. Trahan, Durham, N.C.; Joseph Marshall Haas, Jr.; Joseph C. Steinberg, both of Austin, Tex.

[73] Assignee: Motorola, Inc., Schaumburg, Ill.

[21] Appl. No.: 841,781

[22] Filed: May 5, 1997

Related U.S. Application Data

[63] Continuation of Ser. No. 368,505, Jan. 3, 1995, abandoned.

[51] Int. Cl.⁶ .................. H01L 21/70; H01L 27/00
[52] U.S. Cl. .................. 438/250; 438/251; 438/393
[58] Field of Search .................. 438/250, 251, 438/393

[56] References Cited

U.S. PATENT DOCUMENTS

| | | | |
|---|---|---|---|
| 4,163,243 | 7/1979 | Kamins et al. | 357/41 |
| 4,335,505 | 6/1982 | Shibata et al. | 29/577 R |
| 4,441,249 | 4/1984 | Alspector et al. | 29/577 |
| 4,980,732 | 12/1990 | Okazawa | 257/42 |
| 5,037,772 | 8/1991 | McDonald | 437/52 |
| 5,166,085 | 11/1992 | Wakai et al. | 437/40 |
| 5,196,233 | 3/1993 | Chan et al. | 437/52 |

*Primary Examiner*—Jey Tsai
*Attorney, Agent, or Firm*—George R. Meyer

[57] ABSTRACT

A capacitor for a semiconductor device is formed by selectively processing a portion of a layer (41, 113) to form an electrode (411, 81, 101, 111) for the capacitor. The selective processing includes selective doping, selective silicidation, selective oxidation, or the like. Contacts can be made to the electrode (411) with a reduced likelihood of the contact electrically shorting the electrodes of the capacitor together. When forming contact openings, misalignment tolerance is increased.

16 Claims, 4 Drawing Sheets

PROCESS FOR FORMING A SEMICONDUCTOR DEVICE INCLUDING A CAPACITOR

This application is a continuation of prior patent application Ser. No. 08/368,505 filed Jan. 3, 1995, abandoned.

FIELD OF THE INVENTION

The present invention relates to semiconductor devices, and in particular, to capacitors used in those devices and processes for forming the devices.

BACKGROUND OF THE INVENTION

Semiconductor devices require small components, such as capacitors. As devices become smaller, it is more difficult to form one or both of the electrodes for the capacitor, as well as, make a contact to either one of the electrodes.

FIG. 12 includes a cross-sectional view of a portion of a semiconductor substrate 10 that has a field isolation layer 11 overlying the primary surface of the substrate 10. A first capacitor electrode 201 is over the field isolation layer 11 and a capacitor dielectric 203 is adjacent to that lower electrode. The capacitor may require the upper electrode to be very small to reduce the amount of capacitance between the two plates thereby reducing the capacitance of the capacitor.

In order to form electrode 205, a patterning step is needed to define the shape of the electrode. If the width of the electrode 205 is small, it is difficult to pattern the layer to form the electrode 205 with the correct dimension. More specifically, if layer 205 is to have a sub-lithographic width, the formation of this electrode is difficult. The difficulty is not overcome by the formation of spacers. Spacers are good for forming very narrow openings within a layer but are not as good for forming very narrow features that are to remain on the substrate.

Even if the electrode 205 can be formed to the correct dimension, a contact to the electrode 205 is difficult to form. Referring to FIG. 12, the device includes an insulating layer 71 having a contact opening with a contact plug 207 formed to the top electrode 205. An interconnect 209 overlies the contact plug 207. When forming the contact opening to the upper electrode 205, layers 71 and 203 are typically etched. If layers 71 and 203 are etched within the contact opening, the contact plug 207 contacts both electrodes 201 and 205 thereby electrically shorting the electrodes of the capacitor to each other. The formation of a small capacitance capacitor within a semiconductor device is difficult because of requirements for a narrow width electrode and making a contact to that electrode.

SUMMARY OF THE INVENTION

The present invention includes a semiconductor device including a capacitor that comprises a first electrode, a dielectric layer adjacent to the first electrode, and a first layer adjacent to the dielectric layer. The first layer includes a first portion and a second portion. The first portion is conductive and is a second electrode, and the second portion is not conductive. The present invention includes processes for forming the device.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Selective processing is used to form a conductive portion and a non-conductive portion of a layer or member. The conductive portion is an electrode of a capacitor. Contacts to the conductive portion are made without forming an electrical short between the electrodes. Also, a capacitor with a sub-lithographic width is formed without using marginal processing steps. The present invention will be better understood with embodiments described below.

SELECTIVELY DOPED CAPACITOR

In one specific embodiment a capacitor will be formed with an n-channel metal oxide semiconductor field effect transistor (MOSFET). In this particular device, a conductive member will be both the gate electrode for the n-channel MOSFET and the lower electrode of the capacitor. In other words, the gate electrode of the MOSFET is electrically connected to the bottom electrode of the capacitor. In other embodiments, the conductive member can be electrically connected to a source region or drain region of the n-channel MOSFET via a buried, shared, or butting contact. In still other embodiments, the n-channel MOSFET may be replaced by a p-channel MOSFET or a bipolar transistor including an npn transistor or a pnp transistor.

Figure 1:
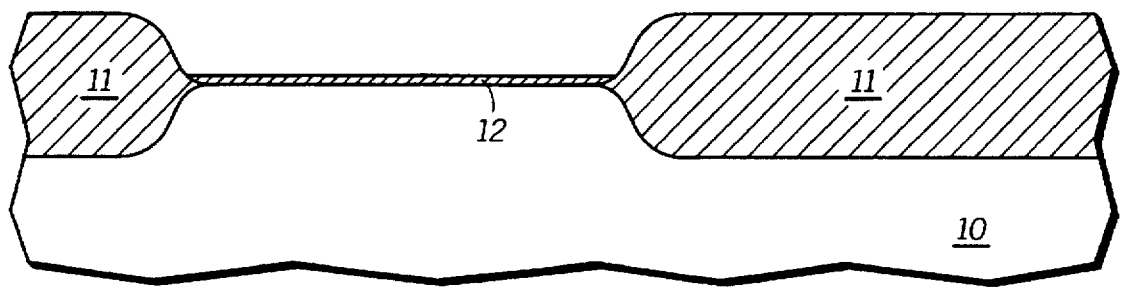
FIG. 1 includes an illustration of a cross-sectional view of a portion of a semiconductor substrate after forming field isolation regions and a gate dielectric layer.

FIG. 1 includes an illustration of a cross-sectional view of a portion of a semiconductor substrate 10 that includes a field isolation region 11 and gate dielectric layer 12 formed over the substrate 10. The substrate 10 typically includes any semiconductor material or it could be replaced by a well region within a semiconductor substrate, a well region within a larger well region, or a silicon mesa of a semiconductor-on-insulator substrate. The field isolation region 11 typically includes an insulating material, such as oxide and the like, and the gate dielectric layer 12 typically includes an oxide, a nitride, a nitrided oxide, or the like. The gate dielectric layer 12 is formed by a thermal reaction (oxidation or nitridation), chemical vapor deposition, or a combination of thermal reaction and chemical vapor deposition.

Figure 2:
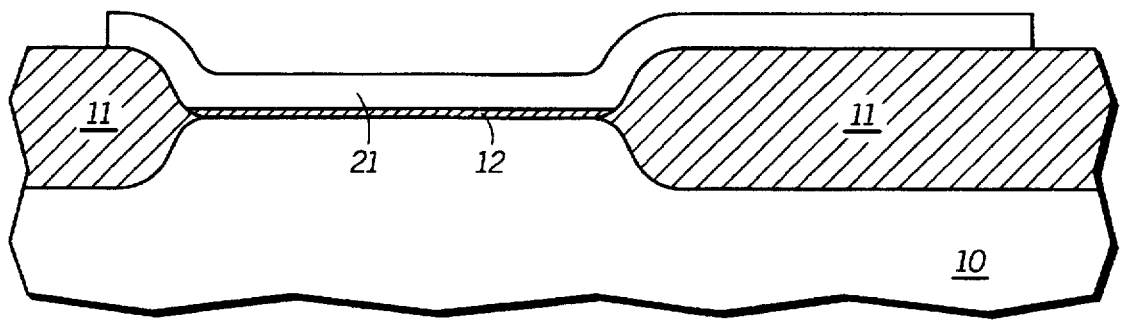
FIG. 2 includes a cross-sectional view of the substrate of FIG. 1 after forming a conductive member over portions of the gate dielectric layer and field isolation regions.

A silicon layer is deposited over the gate dielectric layer 12 and field isolation region 11. The silicon layer typically includes polycrystalline or amorphous silicon. The silicon layer is then doped to make it conductive. The dopant used for the silicon layer includes a p-type dopant, such as boron and the like, or an n-type dopant, such as arsenic, phosphorus, and the like. The dopant concentration within this silicon layer will be at least 1E19 atoms per cubic centimeter. The doped silicon layer is then patterned to form a conductive member 21 that overlies a portion of the gate dielectric layer 12 and the field isolation region 11 as shown in FIG. 2. In another embodiment, the conductive member 21 includes in-situ doped silicon (polycrystalline or amorphous) or a metal-containing material, such as a silicide, titanium, tungsten, and the like.

Figure 3:
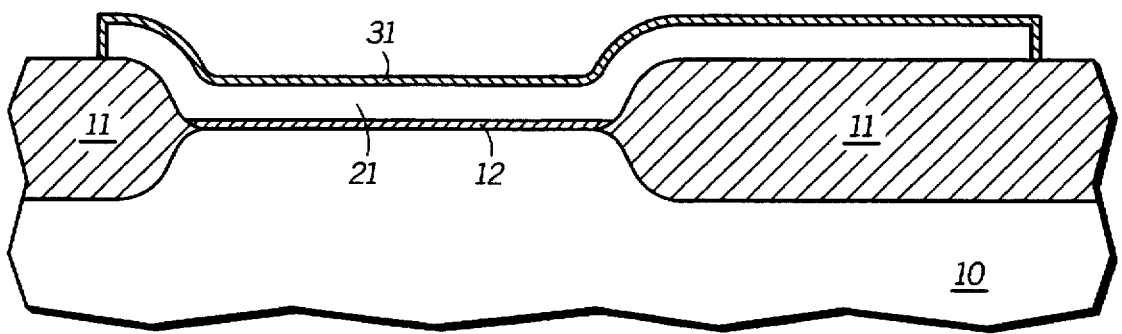
FIG. 3 includes an illustration of a cross-sectional view of the substrate of FIG. 2 after forming a capacitor dielectric layer over the conductive member.

A capacitor dielectric layer 31 is formed over a portion of the conductive member 21 as shown in FIG. 3. The capacitor dielectric layer 31 typically includes an oxide, a nitride, a nitrided oxide, or the like. The capacitor dielectric layer 31 is formed by a thermal reaction (oxidation or nitridation), chemical vapor deposition, or a combination of thermal reaction and chemical vapor deposition.

Figure 4:
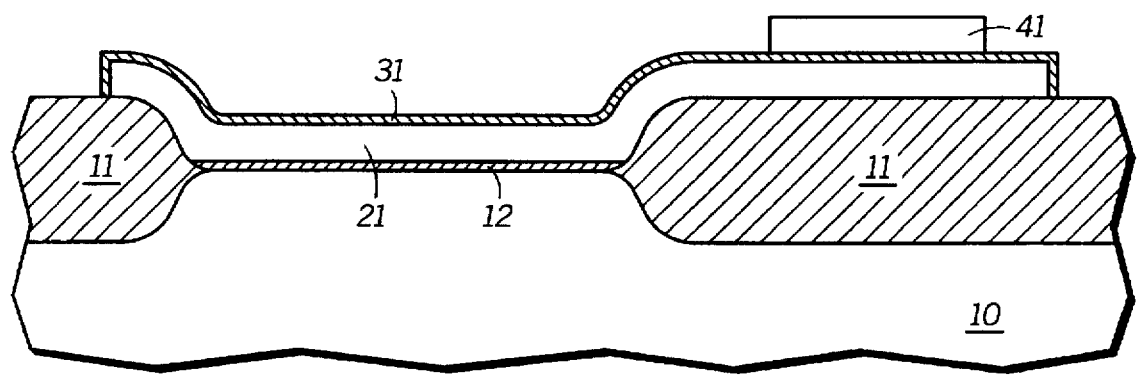
FIG. 4 includes an illustration of a cross-sectional view of the substrate of FIG. 3 after forming a semiconductor layer over a portion of the capacitor dielectric layer.

A layer of semiconductor material is formed over the capacitor dielectric layer 31. The semiconductor material layer includes silicon, germanium, silicon germanium, silicon carbide, or the like. Typically, the semiconductor layer is undoped, however, the layer may include a small amount of dopant (1E17 atoms per cubic centimeter or less). The semiconductor layer is then patterned to form a semiconductor member 41 as shown in FIG. 4.

Figure 5:
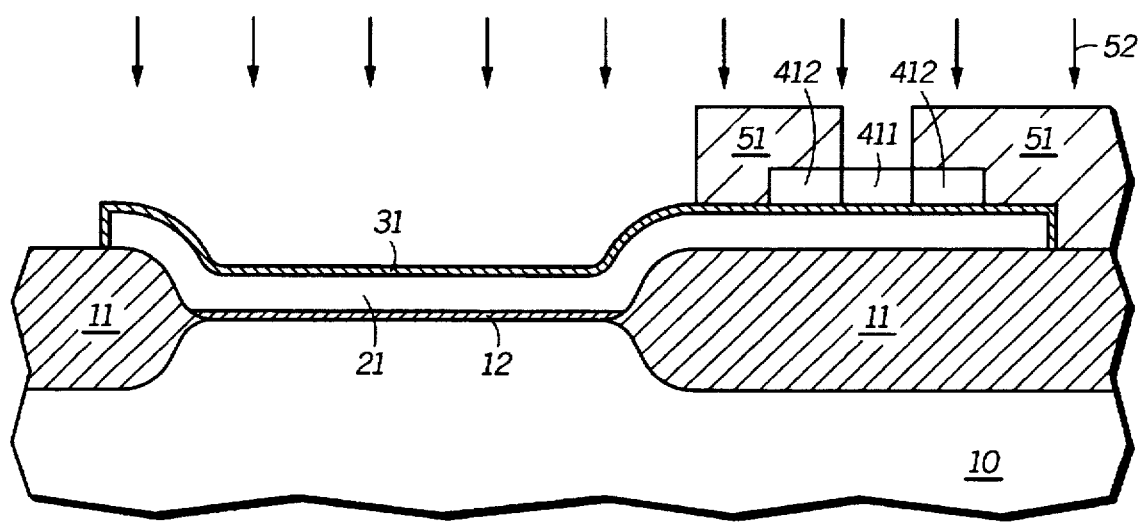
FIG. 5 includes an illustration of a cross-sectional view of the substrate of FIG. 4 during an ion implanting step.

A masking layer 51 is formed and patterned over a portion of the semiconductor member 41 as shown in FIG. 5. The substrate and semiconductor member 41 is then selectively doped by ion implanting with an n-type dopant including phosphorus, arsenic, or the like. The ion implantation is shown by the arrows 52. During this dopant step, the source and drain regions of the MOSFET (not shown in FIG. 5) and a conductive portion 411 of the semiconductor member 41 are doped as shown in FIG. 5. The portions of the semiconductor member 41 that are not ion implanted are undoped portions 412.

Figure 6:
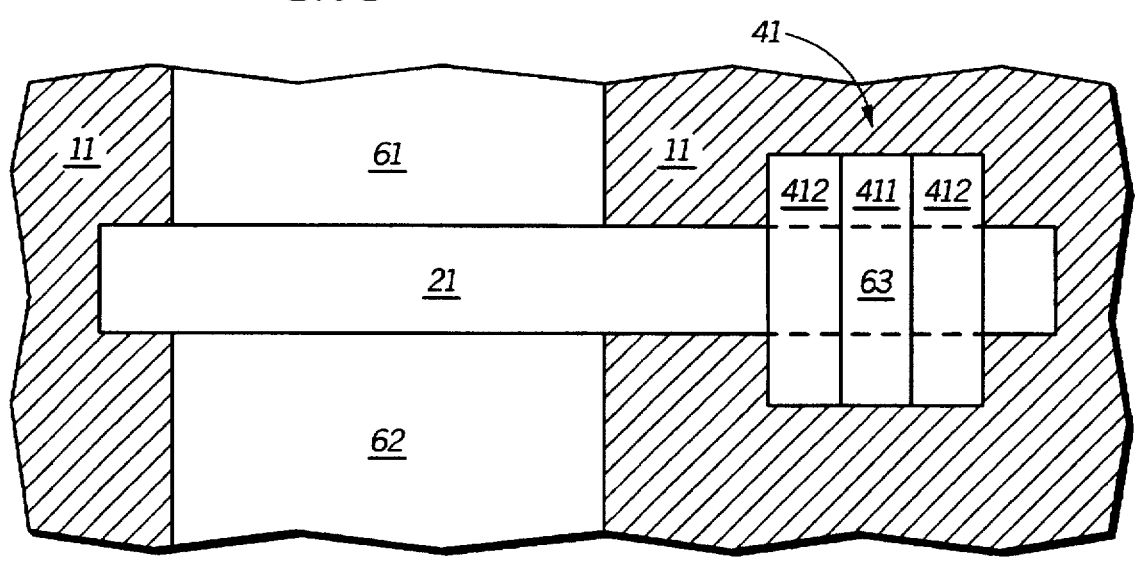
FIG. 6 includes a plan view of the substrate of FIG. 5 after removing masking members.

The masking layer 51 is then removed to form the device as shown in FIG. 6. The doping step forms a source region 61 and a drain region 62. The positional relationships between the conductive member 21 and the semiconductor member 41, which includes doped and undoped portions 411 and 412, are shown in FIG. 6. For simplicity, dielectric layers are not shown in FIG. 6. Each of the conductive portion 411, source region 61, and drain region 62 has a doping concentration of at least 1E19 atoms per cubic centimeter.

The portion of the conductive member 21 that extends under the semiconductor member is illustrated by dash lines. In this particular embodiment, virtually all of the capacitance between the conductive member and the semiconductor member is that section of the portion 411 that lies adjacent to the top and sides of the conductive member 21. That section generally corresponds to area 63. The portion 411 is the upper electrode and has a width that is narrower than the conductive member 21 that is the lower electrode.

Figure 7:
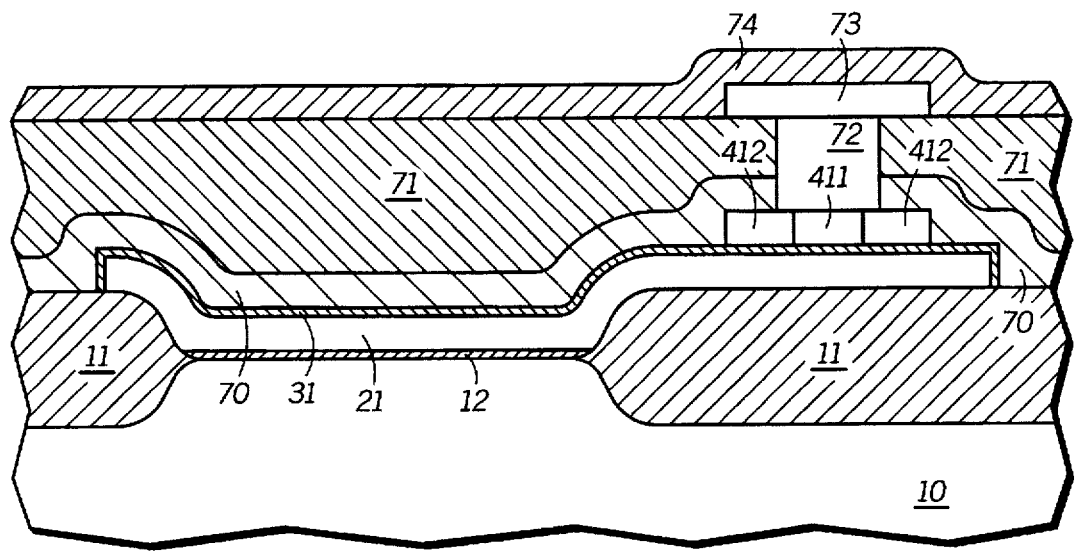
FIG. 7 includes an illustration of a cross-sectional view of the substrate of FIG. 6 after forming a substantially completed device.

The substrate is further processed to form a substantially completed device as shown in FIG. 7. An undoped insulating layer 70 is formed over the capacitor dielectric layer 31 and the semiconductor member 41. The undoped insulating layer 70 includes a nitride, an oxide, or a combination thereof. The undoped insulating layer 70 is used to keep the undoped portions 412 from becoming doped during subsequent processing. A doped insulating layer 71 is formed over the undoped insulating layer 70. The doped insulating layer 71 typically includes boron, phosphorous, or the like.

An opening is formed through the insulating layers 70 and 71 to form a contact opening that is filled with a conductive material. This conductive material typically includes a metal-containing material. Portions of the conductive material overlying the insulating layer 71 is removed to form contact plug 72. An interconnect 73 is then formed over the contact plug 72, and a passivation layer 74 is formed over the interconnect 73.

Other additional insulating layers or interconnects are formed if needed. In addition, other electrical connections may be made to the conductive member 21 or source or drain regions or other portions of the device that are not shown in FIG. 7. In another embodiment, the contact plug 72 is not used, and interconnect 73 extends within the opening to make direct contact to portion 411.

An adhesion or barrier layer may be formed prior to forming the contact plug 72 or interconnect 73. The adhesion or barrier layer is on the order of hundreds of angstroms and does not fill the contact opening within the insulating layers 70 and 71. To reduce contact resistance, a portion of the semiconductor member 41 that lies within the contact opening may be doped before the contact plug 72 is formed. If the semiconductor member 41 is extended further over the field isolation region 11 and the contact plug 72 is formed over the field isolation region 11, the doping of the semiconductor member 41 within the contact opening does not affect the capacitance of the capacitor.

Within FIG. 7, the contact plug 72 overlies and contacts the undoped portions 412. This should not increase the capacitance of the capacitor because the undoped portions 412 are resistive. Any electrical potential of the doped portions 412 immediately adjacent to the capacitor dielectric layer 31 should be negligible. Therefore, virtually all of the capacitance is determined by the capacitance between conductive member 21 and the conductive portion 411.

ALTERNATE EMBODIMENTS

Figure 8:
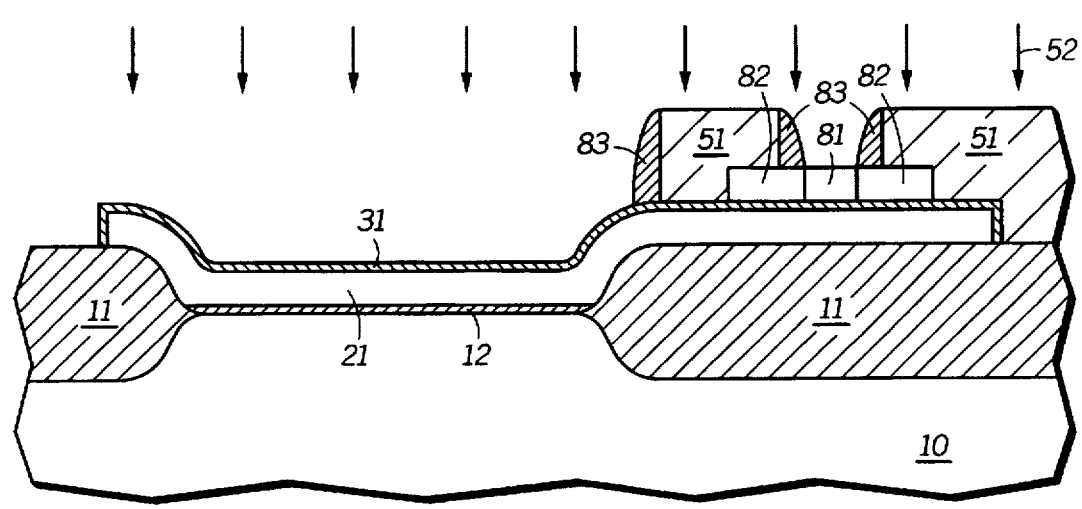
FIG. 8 includes a cross-sectional view of a portion of a semiconductor substrate during an ion implanting step in accordance with an alternate embodiment.

FIG. 8 includes an illustration of a cross-sectional view of a portion of the substrate 10, the field isolation region 11, gate dielectric layer 12, conductive member 21, capacitor dielectric layer 31, and masking layer 51, as previously described. The masking layer has a masking layer opening. In this particular embodiment, spacers 83 are formed immediately adjacent to the sides of the masking layer 51. Some of the spacers 83 are formed within the masking layer opening to form a spacer opening that is smaller than the masking layer opening. In one embodiment, the masking layer 51 includes oxide, and the spacers 83 include nitride. Alternatively, the masking layer 51 could include nitride, and the spacers 83 could include oxide. In any event, the spacers 83 and masking layer 51 include different materials, and the spacers 83 include a different material than the underlying silicon member.

In this particular embodiment the substrate is then subjected to ion implant as shown by the arrows 52 to form a conductive portion 81 and undoped portions 82 as shown in FIG. 8. Portion 81 is formed to have a sub-lithographic width. Therefore, the doped portion 81 can be formed to be quite narrow. In an alternative embodiment not shown, the spacers 83 could be used for a selective silicidation using titanium chloride. More specifically, the substrate would be exposed to titanium chloride gas while the semiconductor material beneath the opening is exposed. The titanium chloride gas reacts with the silicon exposed underneath the spacer opening and forms titanium silicide.

Figure 9:
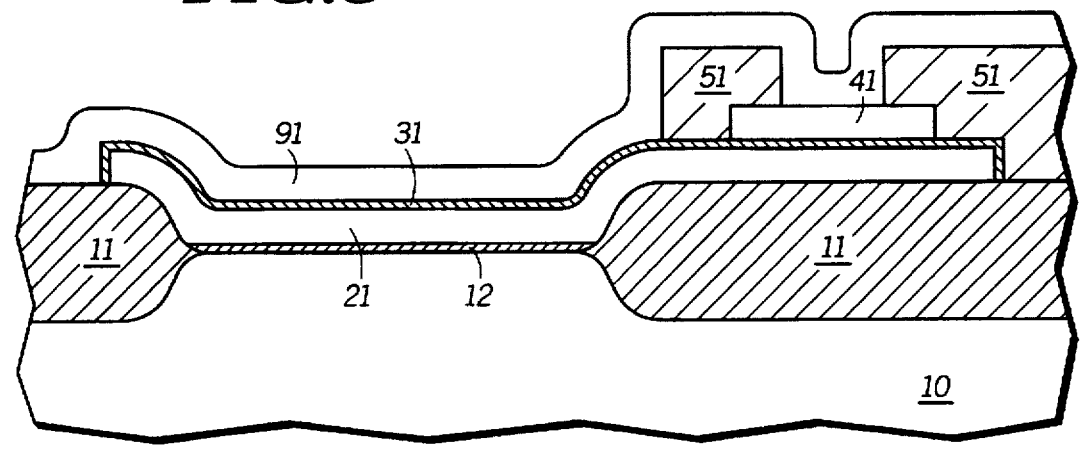
FIGS. 9 and 10 include illustrations of cross-sectional views of a portion of a semiconductor substrate in performing a selective silicidation reaction in accordance with another embodiment.
Figure 10:
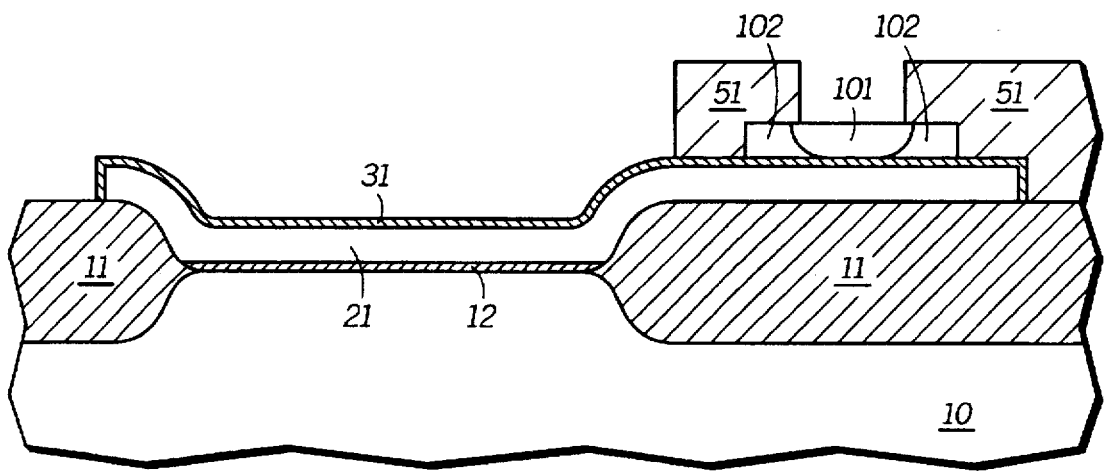

FIGS. 9 and 10 include another embodiment that is somewhat similar to the silicide reaction previously described. In FIG. 9, the masking layer 51 is formed over the semiconductor member 41 and then a titanium layer 91 is deposited over all of the substrate 10. A silicidation reaction is then performed such that the titanium layer 91 reacts with the portion of the semiconductor member 41 lying within the opening of the masking layer 51. This forms titanium silicide as shown in FIG. 10 as portion 101. Portions 102 are unreacted portions of the semiconductor member 41 as shown in FIG. 10 and are similar to portions 412 of a previous embodiment. After the reaction step is completed, unreacted portions of the titanium layer 91 are removed using a solution including ammonia hydroxide and peroxide. This solution does not significantly etch the silicided portion 101 thereby leaving the silicided portion and removing unreacted titanium. In addition to titanium, other metals including cobalt, platinum, tungsten, and the like could be used.

Figure 11:
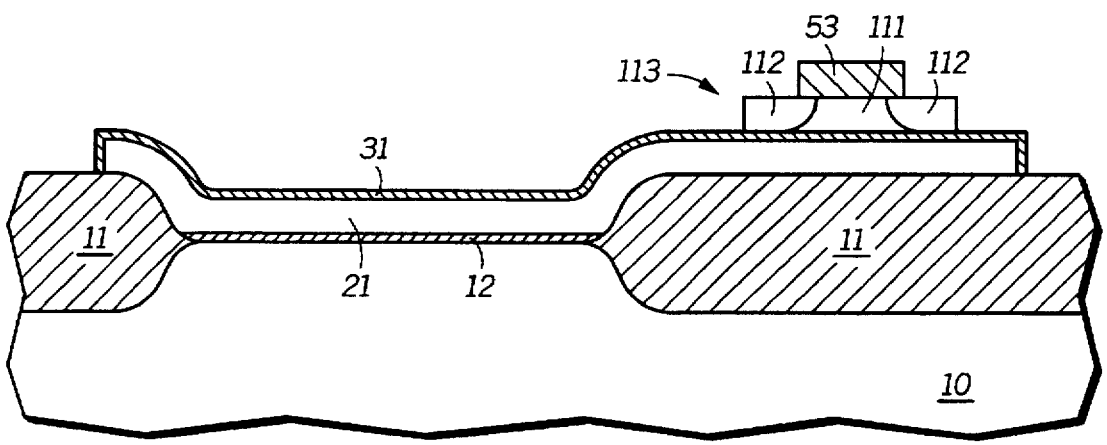
FIG. 11 includes an illustration of a cross-sectional view of a portion of a substrate after selectively oxidizing a portion of a layer in accordance with another embodiment.
Figure 12:
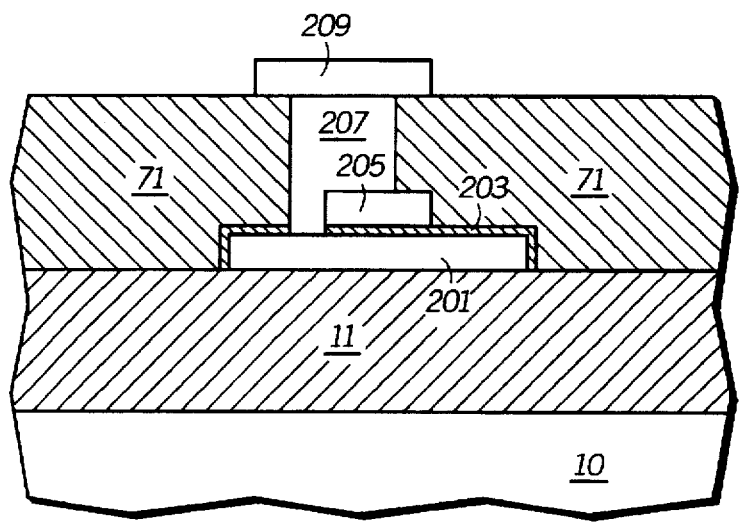
FIG. 12 includes an illustration of a cross-sectional view of a portion of a substrate showing how a contact plug electrically shorts the electrodes of a capacitor.

FIG. 11 illustrates yet another embodiment. A conductive member 113 is formed over the capacitor dielectric layer 31 and a masking member 53 is formed over the member 113. The member 113 could include doped silicon or a metal-containing material that is capable of being oxidized to silicon dioxide or a metal oxide that is not conductive. For example, member 113 could include doped silicon, aluminum, copper, titanium, or titanium silicide. The masking member 53 acts as an oxidation mask and includes silicon nitride, aluminum nitride, or the like.

After forming conductive member 113 and masking member 53, the structure is oxidized to convert exposed portions of the member 113 to its corresponding oxide shown as oxidized portions 112 in FIG. 11. Oxidized portions 112 are not conductive and include silicon dioxide, aluminum oxide, copper oxide, or titanium dioxide. In addition, if a partial oxidation occurs and the member 113 includes titanium, then titanium monoxide is formed that is a semiconductor. In other words, each of portions 112 is an insulator or a semiconductor.

Portion 111 is unaffected by the oxidation step because the masking member 53 prevents the oxidation of portion 111. Therefore, portion 111 is conductive and is essentially the same as the member 113 prior to the oxidation step. Portions 111 and 112 generally include a conductive material and an oxide of that conductive material where the oxide is not conductive.

In embodiments previously described, selective processing of a single uniform material layer is performed such that the layer has conductive and non-conductive (insulating or semiconductive) portions. The conductive portion is an electrode for a capacitor. In some instances, the layer is not conductive and made conductive. In yet other embodiments, the layer is conductive and portions are made non-conductive. In addition to the embodiments shown, the capacitor electrodes could be switched in that the patterned electrode lies underneath an upper electrode. Also, one of the electrodes may be a doped region within a semiconductor substrate.

BENEFITS

Embodiments of the present invention allow a low capacitance capacitor to be formed within a semiconductor device. A layer having both conductive and non-conductive portions help to reduce the likelihood that a contact plug or interconnect will form an electrical short between the electrodes of the capacitor. Put in other terms, misalignment tolerance when contact openings are formed is increased. Further, the capacitance is controlled by controlling the width of the conductive portion of the layer.

The embodiments do not require the use or development of marginal (non-reproducible) processing steps or exotic materials. The embodiments can be incorporated into an existing process flow without having to make radical changes to those process flows.

In the foregoing specification, the invention has been described with reference to specific embodiments thereof. However, it will be evident that various modifications and changes can be made thereto without departing from the broader spirit or scope of the invention as set forth in the appended claims. Accordingly, the specification and drawings are to be regarded in an illustrative rather than a restrictive sense.

We claim:

1. A process for forming a semiconductor device including a capacitor comprising the steps of:

forming a first electrode forming a dielectric layer adjacent to the first electrode;

forming a first layer adjacent to the dielectric layer, wherein:

the first layer includes a semiconductor material or a metal-containing material; and the first layer has a first portion, a second portion, and a third portion, wherein the second portion lies between the first and third portions; and the first electrode is adjacent to the first, second, and third portions; and selectively processing the first layer to form a first portion, a second portion, and a third portion, wherein:

the first and third portions are not conductive;

the second portion is conductive and is a second electrode; and the first, second, and third portions include a same atomic element, wherein the capacitor includes the first electrode, the dielectric layer, and the second electrode.

2. The process of claim 1, wherein:

the process further includes a step of forming an oxidation mask over the second portion that includes the metal-containing material before the step of selectively processing; and the step of selectively processing includes oxidizing the first and third portions of the first layer.

3. The process of claim 1, wherein the step of selectively processing comprises a step of selectively doping the first layer such that the second portion is doped with a dopant to a dopant concentration of at least 1E19 atoms per cubic centimeter but the first and third portions are not doped with the dopant.

4. The process of claim 1, further comprising steps of:

forming a masking layer including a first opening over the first layer; and forming a spacer within the first opening to form a second opening prior to the step of selectively processing, wherein the second opening overlies the second portion of the first layer.

5. The process of claim 1, wherein:

the first electrode has a first electrode width;

the second portion has a second portion width; and the second portion width is narrower than the first electrode width.

6. The process of claim 1, wherein:

the process further includes a step of forming a mask over the first and third portions of the first layer; and the step of selectively processing includes a step of exposing the second portion of the first layer to a metal-containing material.

7. The process of claim 6, wherein the metal-containing material is a gas during the step of exposing.

8. The process of claim 6, wherein:

the first layer includes silicon;

the step of exposing includes depositing a metal layer over the second portion of the first layer; and the step of selectively processing further includes a step of reacting the second portion of the first layer with the metal layer to form a silicide.

9. A process for forming a semiconductor device including a capacitor comprising the steps of:

forming a first conductive member adjacent to a semiconductor substrate, wherein the first conductive member includes a semiconductor material and a first dopant at a first dopant concentration of at least 1E19 atoms per cubic centimeter;

forming a dielectric layer adjacent to the first conductive member;

forming a second member of a semiconductor material adjacent to the dielectric layer, wherein:

the second member has a first portion, a second portion, and a third portion, wherein the second portion lies between the first and third portions; and the first conductive member is adjacent to the first, second, and third portions; and selectively doping the second member with a second dopant to a second dopant concentration of at least 1E19 atoms per cubic centimeter, wherein the second portion is doped during this step but the first and third portions are not doped during this step, wherein the capacitor includes the first conductive member, the dielectric layer, and the second portion of the second member.

10. The process of claim 9, wherein further comprising steps of:

forming a masking layer including a first opening over the second member; and forming a spacer within the first opening to form a second opening, wherein the second opening overlies the second portion of the second member.

11. The process of claim 8, wherein the step of forming the first conductive member is performed prior to step of forming the second member.

12. The process of claim 1, further comprising steps of:

forming an insulating layer over the first layer;

patterning the insulating layer to form an opening over the first layer; and forming a conductive structure within the opening, wherein the conductive structure:

contacts both the first and second portions; and is selected from a group consisting of a contact plug and an interconnect.

13. The process of claim 9, wherein:

the first conductive member has a first conductive member width;

the second portion of the second member has a second portion width; and the second portion width is narrower than the first conductive member width.

14. The process of claim 1, further comprising steps of:

forming an insulating layer over the second member;

patterning the insulating layer to form an opening over the second member; and forming a conductive structure within the opening, wherein the conductive structure:

contacts both the first and second portions; and is selected from a group consisting of a contact plug and an interconnect.

15. The process of claim 1, wherein the step of selectively processing is performed such that the first portion includes an undoped semiconductor material.

16. The process of claim 9, wherein the step of forming the second member comprises a step of forming the second member of an undoped semiconductor material.

\* \* \* \* \*

UNITED STATES PATENT AND TRADEMARK OFFICE
CERTIFICATE OF CORRECTION

PATENT NO. : 5,714,411
DATED : February 3, 1998
INVENTOR(S) : Robert J. Trahan

It is certified that error appears in the above-identified patent and that said Letters Patent is hereby corrected as shown below:

Column 6,
Line 46, change "a first" to -- the first --
change "a second" to -- the second --
change "a third" to -- the third --

Signed and Sealed this

Fourth Day of December, 2001

Attest:

*Attesting Officer*

NICHOLAS P. GODICI
*Acting Director of the United States Patent and Trademark Office*